United States Patent
Van Ryzin

[19]

[11] Patent Number: 6,011,854
[45] Date of Patent: Jan. 4, 2000

[54] AUTOMATIC RECOGNITION OF AUDIO INFORMATION IN A BROADCAST PROGRAM

[75] Inventor: John M. Van Ryzin, Madison, N.J.

[73] Assignees: Sony Corporation, Tokyo, Japan; Sony Electronics, Inc., Park Ridge, N.J.

[21] Appl. No.: 08/932,494

[22] Filed: Sep. 18, 1997

[51] Int. Cl.[7] ........................................ H04B 3/00
[52] U.S. Cl. ..................... 381/77; 455/186.1; 455/161.1
[58] Field of Search .................... 381/77, 86, 2; 455/45, 186.1, 161.1, 161.2

[56] References Cited

U.S. PATENT DOCUMENTS

| | | | |
|---|---|---|---|
| 4,481,593 | 11/1984 | Bahler | 704/253 |
| 5,584,051 | 12/1996 | Goken | 455/45 |
| 5,842,119 | 11/1998 | Emerson et al. | 455/161.3 |

OTHER PUBLICATIONS

Dexter, "A New Age for Radio", Popular Electronics, pp. 40, 41, 102, Oct. 1989.

Primary Examiner—Ping Lee
Attorney, Agent, or Firm—Frommer Lawrence & Haug, LLP.; William S. Frommer

[57] ABSTRACT

An audio processing system searches for information reports or updates (such as traffic, weather, time, sports, news, and the like) broadcast over one or several radio stations. The search is based on at least one keyword (such as "traffic", "weather", "time", "sports", "news" depending on the desired report) being preselected by the user, and being entered into the audio processing system. While speech recognition software used by the audio processing system scans the radio station for the requested information report, the user may listen to other audio sources (a CD, a tape, another radio station broadcast, etc.) without being required to monitor (that is, listen to) the information content from those audio sources. Once the requested information report is detected based on the entered keyword used in the radio broadcast, the audio processing system switches its audio output to the radio station transmitting the desired broadcast, such that the user can timely and conveniently listen to the traffic, weather, time, sports, and/or news reports or updates.

8 Claims, 2 Drawing Sheets

AUTOMATIC RECOGNITION OF AUDIO INFORMATION IN A BROADCAST PROGRAM

BACKGROUND OF THE INVENTION

The present invention is related to audio systems and, in particular, to apparatus and method for automatically recognizing a particular information report or update being broadcast over a radio station while listening to another audio source device, and for switching to the radio station when the desired information report is detected.

When listening to an audio source such as a tape player, Compact Disk (CD) player or the like, a person may want to get an information report or update on the latest news, traffic, sports, weather or time, for example. In this situation, one option for the person to pursue is to switch to an AM/FM receiver or radio device, find a radio station and hope that the desired information report will be broadcast soon. Obviously, the person is at the mercy of a program format used by the radio station and may wait (and suffer through the dull program content) for a considerable amount of time before the desired information is transmitted. In addition to inconvenience caused by the interruption in listening to the tape or CD, the person may be driving a car and wanting to obtain a traffic update immediately. By the time the traffic report is heard on the randomly selected radio station, however, it may be too late, resulting in unnecessary delay and frustration.

Alternatively, after switching to the AM/FM receiver, the person may scan radio stations available for reception in the area for the desired information report. This procedure will require either manually tuning to the radio stations, which is a time consuming procedure and may create a safety hazard by requiring the person to take his/her eyes off the road when he/she is driving; or using an automatic scan feature available in receivers, which also demands the person's attention (creating a dangerous situation when driving, for example) by requiring that the automatic scanning be timely stopped before the tuner "jumps" to the next radio station, once the desired information update is found.

OBJECTS OF THE INVENTION

It is an object of the present invention to overcome the above disadvantages.

It is another object of the present invention to detect and listen to an information report without the necessity to monitor the audio output of radio stations.

It is a further object of the present invention to tune to a radio station automatically selected from a number of radio stations, which broadcasts a desired information report.

SUMMARY OF THE INVENTION

These and other objects, features and advantages are accomplished by audio processing apparatus and method for outputting preselected audio information detected from a program reproduced via output means. A tuner, tuned to a broadcast station, generates an audio output signal corresponding to the program transmitted by the broadcast station. A programmable controller receives the audio output signal from the tuner and determines whether the preselected audio information is present in the audio output signal. A switch, controlled by the programmable controller, supplies the audio output signal to the output means for reproducing the program when the preselected audio information is present in the audio output signal.

In accordance with one aspect of the present invention, the programmable controller receives a keyword representative of the preselected audio information which is detected from the program based on the keyword. The programmable controller executes a speech recognition code for recognizing the keyword used in the program.

In accordance with another aspect of the present invention, at least one device generates audio data reproduced via the output means, wherein that device is connected to the switch for selectively providing the audio data to the output means when the preselected audio information is not present in the audio output signal.

BRIEF DESCRIPTION OF THE DRAWINGS

The above-mentioned as well as additional objects, features and advantages of the present invention will become readily apparent from the following detailed description thereof which is to be read in conjunction with the accompanying drawings, in which.

In all Figures, like reference numerals represent the same or identical components of the present invention.

DETAILED DESCRIPTION OF THE PREFERRED EMBODIMENTS

As a general overview, the present invention is defined by an audio processing system that searches for information reports or updates (such as traffic, weather, time, sports, news, or the like) broadcast over a radio station. The search is based on at least one keyword (such as "traffic", "weather", "time", "sports", "news" depending on the desired report) being preselected by the user, and being entered into the audio processing system. While speech recognition software used by the audio processing system scans the radio station for the user selected keyword, the user may listen to other audio sources (a CD, a tape, another radio station broadcast, etc.) without being required to monitor (that is, listen to) the program information content from those audio sources. Once the requested information report is detected based on the entered keyword used in the radio broadcast, the audio processing system switches its audio output to the radio station transmitting the desired broadcast, such that the user can timely and conveniently listen to the traffic, weather, time, sports, and/or news reports or updates.

The present invention will now be explained in detail with reference to the accompanying drawings.

Figure 1:
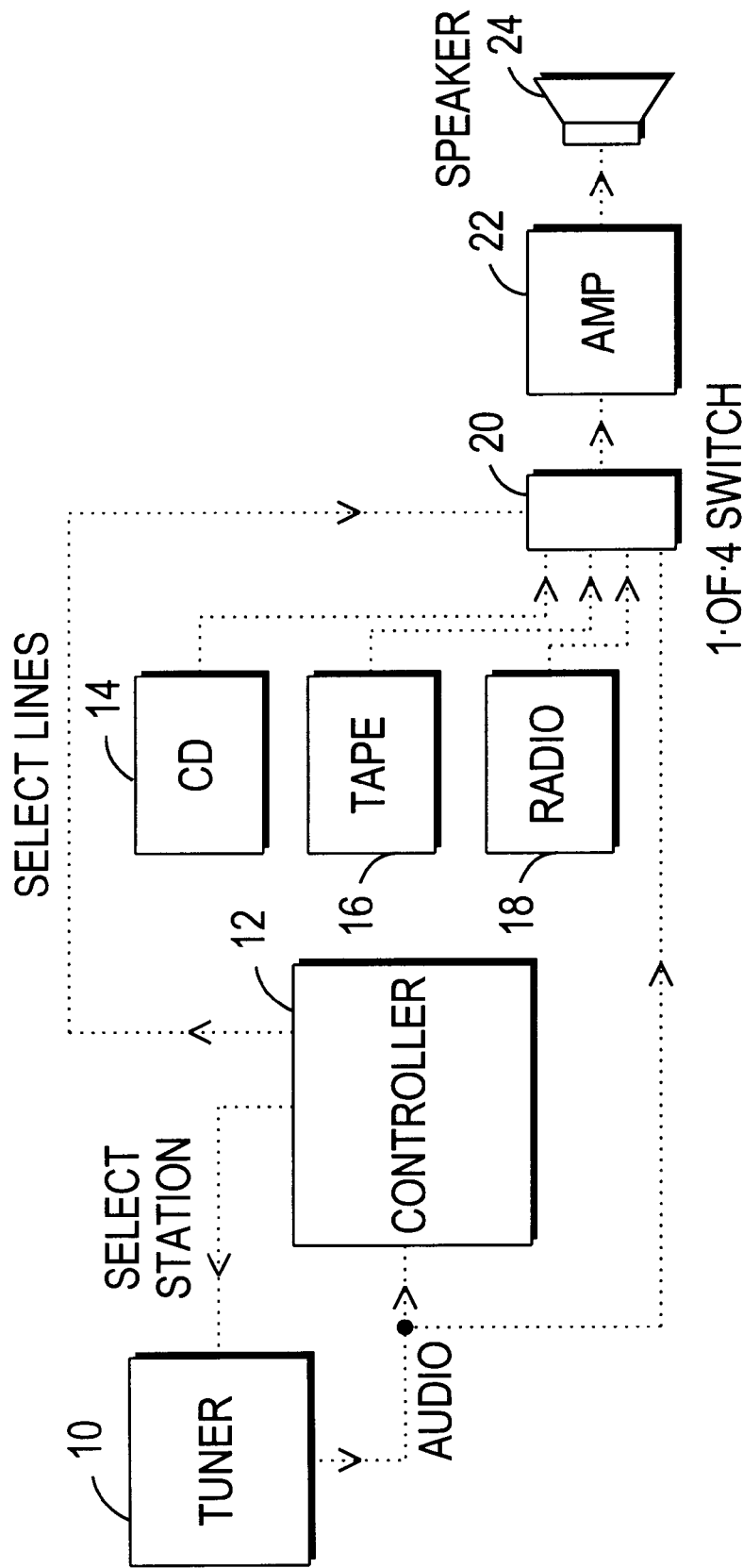
FIG. 1 is a block diagram of an audio processing system according to the present invention.

FIG. 1 shows a block diagram of the audio processing system according to the present invention. A tuner 10 for tuning to a radio station is controlled by signal designated "SELECT STATION" from a programmable controller 12. An output signal "AUDIO" from the tuner 10 is supplied to the controller 12 and to a switch 20, which selects one output signal from the four input signals based on a control signal "SELECT LINES" from the controller 12.

Further shown in FIG. 1 are various audio source devices, such as a CD player 14, a Tape player 16 and a Radio 18 (AM/FM receiver), providing output signals to the switch 20. The output signal from the switch 20, as selected by the controller 12, is supplied to an audio amplifier 22 for reproduction via a speaker 24.

The controller 12 is a programmable device (which may be implemented with a general purpose microprocessor, a digital signal processor, or an application specific controller) that is programmed to perform several functions. Namely, the controller 12 executes an operation determined by a program code for selecting a radio station based on the user input information. Further, by using speech recognition software, the controller 12 can determine when such words as "time", "news", "sports", "weather" and/or "traffic", for example, are used in information reports transmitted from the radio station. As soon as the user-defined keyword is recognized by the controller 12, an additional program code is executed by the controller 12 to control the switch 20 in such a manner that the output signal from the tuner 10 is supplied to the amplifier 22 and the speaker 24. Yet still additional program code is executed by the controller 12 for controlling the switch 20 when other audio source devices (the CD 14, Tape 16, Radio 18) are selected by the user to reproduce the corresponding audio information via the output components (that is, the amplifier 22 and speaker 24).

It is understood, of course, that FIG. 1 illustrates a block diagram of the audio processing system without obfuscating inventive aspects of the present invention with additional elements and/or components which may be required for producing or manufacturing the system. These additional elements and/or components, which are not shown in FIG. 1, are well known to those skilled in the art of audio systems, and are deemed to be unnecessary for understanding the present invention as disclosed herein.

Figure 2:
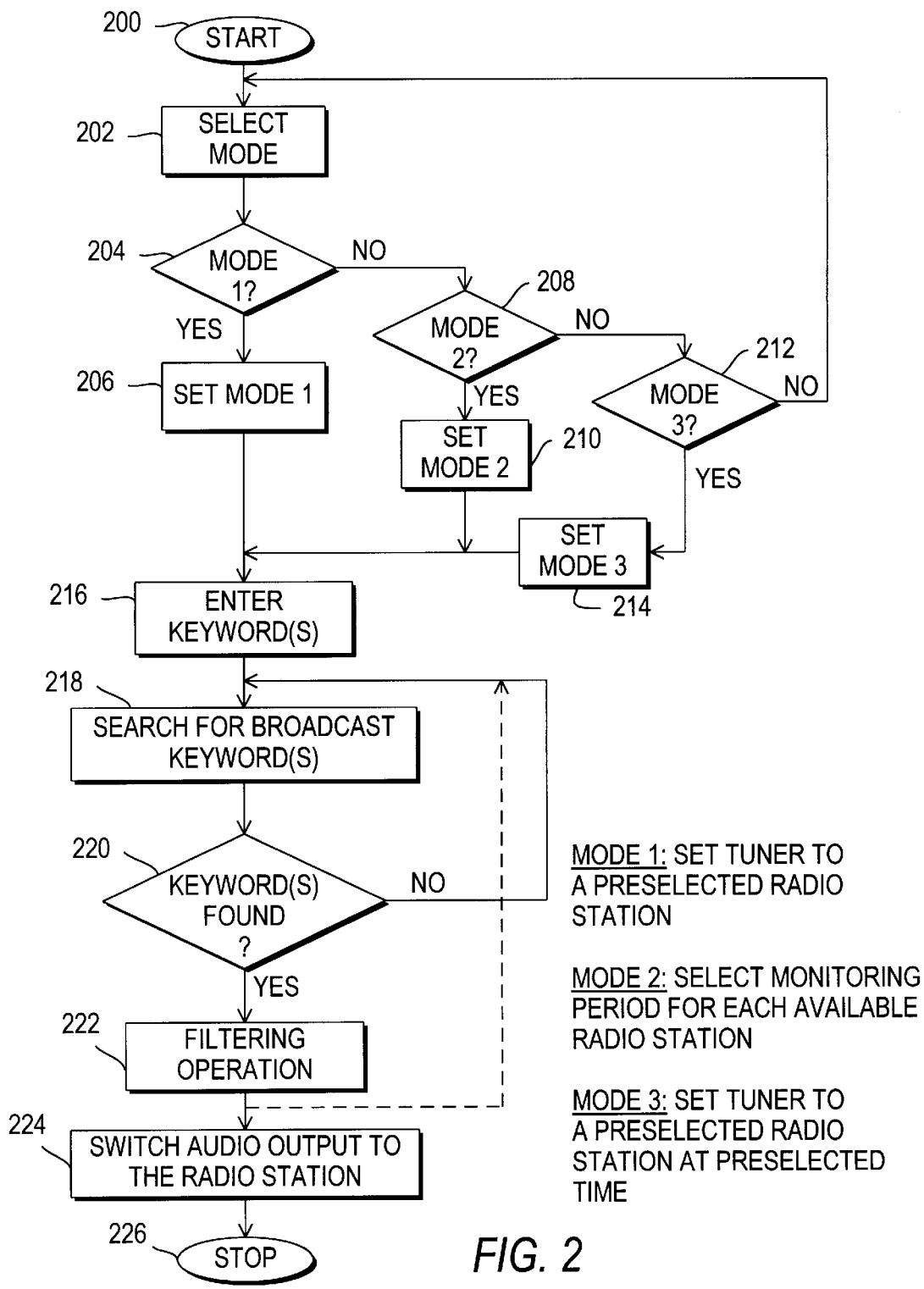
FIG. 2 is a flowchart of the operation of the audio processing system shown in a block diagram form in FIG. 1.

The operation of the audio processing system according to the present invention will now be described with reference to the flowchart of FIG. 2. In particular, in step 200, the operation of the system is started by activating, for example, a switch such that the controller 12 initializes the appropriate registers, devices, etc. In step 202, an operational mode is selected from three available modes, as representatively illustrated in FIG. 2. An operational mode 1 includes setting the tuner 10 to a user selected radio station. That is, in accordance with the user entry of the desired radio station, the controller 12 sets the tuner to the radio station and maintains the program reception from that station throughout the operation. In an operational mode 2, the user selects the monitoring period for each available radio station in the area, as controlled by the controller 12. Namely, in this mode, a radio station is monitored, for example, for 3 seconds for the user selected keyword to appear in the program content. If no keyword is detected in this time period, the tuner 12 under control of the controller 12 "jumps" to the next radio station for performing the monitoring process. Each station is thus selected sequentially for a predetermined period of time. In a mode 3, the tuner 12 is set to a user selected radio station at a preselected time. For example, as controlled by the controller 12, a first radio station may be monitored at 12 noon, while a second radio station may be monitored at 12:10 p.m. Hence, different radio stations may be activated during various time slots, depending on the highest likelihood of the information report appearing on a particular station, as empirically determined by the user, for example.

In step 204, it is determined whether the mode 1 is selected. If so, this mode is set in step 206; otherwise, the controller checks in step 208 whether the mode 2 has been chosen, and sets the mode 2 operation in step 210, if so. If the mode 2 is not set, then a decision is made in step 212 whether to proceed with the mode 3. Based on this decision, either the mode 3 is set in step 214, or the process returns to step 202 for selecting a valid mode.

Regardless of the selected mode, in step 216, a keyword is entered. Namely, the user decides what type of report or update he or she wants to hear, and inputs the corresponding keyword into the system by pressing, for example, a button labeled "weather" or by using any of the input devices associated with a controller, a microprocessor, or a DSP, as known to a skilled artisan.

Thereafter, in step 218, the controller 12, using the embedded speech recognition program or code, begins monitoring one or several radio stations (depending on the operational mode 1, 2 or 3) for the input keyword. When the keyword is detected in step 220, the process continues with step 222; otherwise, the monitoring operation continues by returning to step 218.

After detecting the keyword in step 220, a filtering operation is performed in step 222. The filtering operation may be optionally carried out to reject any "false" occurrences of the input keyword in a song, for example, by analyzing the frequency bands in the broadcast program. If the analyzed program does not conform to the "news" format, then the search continues with step 216. Otherwise, the controller 12 switches, via the switch 20, the audio output of the audio processing system to the radio station. As a result, the desired information report is heard via the speaker 24, and in step 226, the operation is stopped. The user may interrupt the radio broadcast and return to the previous audio source (the CD 14, Tape 16, or Radio 18) at any time by activating a switch or a button, for example, in the audio processing system.

The audio processing system of the present invention can be easily integrated with an audio system in a car or any other type of a vehicle, for example. A minimum of additional hardware is required to supplement the existing audio system in the vehicle, and the program code, including the voice recognition software, for carrying out the operations of the present invention can reside in an on-board controller memory or in a separate semiconductor memory connnected to the controller 12.

In addition to the user convenience, road safety is an additional consideration in implementing the present invention. A driver of the vehicle will not have to fumble with the car radio buttons and switches, trying to find the traffic or weather update on the radio and risking an accident by taking his/her eyes off the road.

While the audio processing system of the present invention can be advantageously used with the car audio system, its use is not limited thereto. Thus, home Audio/Video equipment can just as easily be equipped with the components of the present invention for adding an information detection feature as described hereinabove.

Having described specific preferred embodiments of the invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. Audio processing apparatus for outputting preselected audio information detected from a program which is reproduced via output means, said audio processing apparatus comprising:

a tuner for tuning to an arbitrary broadcast station and for generating an audio output signal corresponding to said program transmitted by said arbitrary broadcast station;

a programmable controller for receiving said audio output signal from said tuner and for receiving from a user an arbitrary keyword representative of said preselected audio information, said programmable controller determining whether said preselected audio information is present in said audio output signal based on the received arbitrary keyword by executing a speech recognition operation for recognizing the received arbitrary keyword in the transmitted program; and a switch controlled by said programmable controller for supplying said audio output signal to said output means for reproducing said program when said preselected audio information is present in said audio output signal.

2. The apparatus according to claim 1, further comprising at least one device for generating audio data reproduced via said output means, said one device being connected to said switch for selectively providing said generated audio data to said output means when said preselected audio information is not present in said audio output signal.

3. The apparatus according to claim 1, wherein said programmable controller is operative to control said tuner for sequentially tuning to a plurality of broadcast stations with a predetermined time interval between tuning to a next broadcast station.

4. The apparatus according to claim 1, wherein said programmable controller is operative to control said tuner for tuning to said broadcast station at a predetermined time.

5. An audio processing method for outputting preselected audio information detected from a program which is reproduced via output means, said method comprising the steps of:

tuning to an arbitrary broadcast station for generating an audio output signal corresponding to said program transmitted by said arbitrary broadcast station;

receiving from a user an arbitrary keyword representative of said preselected audio information;

determining whether said preselected audio information is present in said audio output signal based on the received arbitrary keyword by executing a speech recognition operation for recognizing the received arbitrary keyword in the transmitted program; and supplying said audio output signal to said output means for reproducing said program when said preselected audio information is present in said audio output signal.

6. The method according to claim 5, further comprising generating audio data which is selectively provided to said output means when said preselected audio information is not present in said audio output signal.

7. The method according to claim 5, wherein said step of tuning comprises sequentially tuning to a plurality of broadcast stations with a predetermined time interval between tuning to a next broadcast station.

8. The method according to claim 5, wherein said step of tuning comprises tuning to said broadcast station at a predetermined time.

* * * * *